(12) United States Patent
Gupta et al.

(10) Patent No.: US 10,685,951 B1
(45) Date of Patent: Jun. 16, 2020

(54) WORDLINE STRAPPING FOR NON-VOLATILE MEMORY ELEMENTS

(71) Applicant: GLOBALFOUNDRIES Inc., Grand Cayman (KY)

(72) Inventors: Anuj Gupta, Clifton Park, NY (US); Bipul C. Paul, Mechanicville, NY (US); Joseph Versaggi, Galway, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/214,450

(22) Filed: Dec. 10, 2018

(51) Int. Cl.
*H01L 27/02* (2006.01)
*H01L 27/105* (2006.01)
*H01L 45/00* (2006.01)
*H01L 21/768* (2006.01)
*H01L 43/12* (2006.01)
*G11C 5/06* (2006.01)

(52) U.S. Cl.
CPC .......... *H01L 27/0207* (2013.01); *G11C 5/063* (2013.01); *H01L 21/768* (2013.01); *H01L 27/105* (2013.01); *H01L 43/12* (2013.01); *H01L 45/16* (2013.01)

(58) Field of Classification Search
CPC . H01L 27/0207; H01L 21/768; H01L 27/105; H01L 43/12; H01L 45/16; G11C 5/063
USPC .......................................................... 257/5
See application file for complete search history.

(56) References Cited

U.S. PATENT DOCUMENTS

| 5,644,526 | A | * | 7/1997 | Mazzali | H01L 23/528 257/E23.151 |
|---|---|---|---|---|---|
| 5,933,725 | A | * | 8/1999 | Kirsch | H01L 23/5221 257/E23.143 |
| 5,940,315 | A | | 8/1999 | Cowles | |
| 6,611,062 | B2 | | 8/2003 | Kurjanowicz | |
| 7,675,124 | B2 | | 3/2010 | Liaw | |
| 8,441,850 | B2 | | 5/2013 | Lee et al. | |
| 8,921,179 | B2 | | 12/2014 | Paul et al. | |
| 2002/0140106 | A1 | * | 10/2002 | Kurjanowicz | H01L 23/5225 257/776 |
| 2006/0274596 | A1 | * | 12/2006 | Kim | G11C 8/08 365/230.06 |
| 2007/0164372 | A1 | * | 7/2007 | McDaniel | H01L 27/105 257/401 |

(Continued)

OTHER PUBLICATIONS

D. M. Dong-Sun Min, D. S. Dong-Il Seo, J. Y. Jehwan You, S. C. Sooin Cho, D. C. Daeje Chin and Y. E. Park, "Wordline coupling noise reduction techniques for scaled DRAMs," Digest of Technical Papers., 1990 Symposium on VLSI Circuits, Honolulu, Hawaii, USA, 1990, pp. 81-82.

(Continued)

*Primary Examiner* — Dzung Tran
(74) *Attorney, Agent, or Firm* — Thompson Hine LLP

(57) ABSTRACT

Structures for a non-volatile memory and methods for fabricating such structures. An active array region of a memory structure includes a plurality of active bitcells and a wordline. Dummy bitcells of the memory structure are arranged in a column within the active array region. An interconnect structure includes a metallization level having a wordline strap that extends across the active array region and that is arranged over the active array region.

18 Claims, 4 Drawing Sheets

(56) References Cited

U.S. PATENT DOCUMENTS

2012/0087184 A1* 4/2012 Lee .................. G11C 5/025
365/171
2013/0235639 A1* 9/2013 Lee .................. G11C 5/025
365/51

OTHER PUBLICATIONS

Gupta et al., "Twisted Wordline Structures" filed Sep. 25, 2019 as U.S. Appl. No. 16/582,474.

* cited by examiner

WORDLINE STRAPPING FOR NON-VOLATILE MEMORY ELEMENTS

BACKGROUND

The present invention relates to integrated circuits and semiconductor device fabrication and, more specifically, to structures for a non-volatile memory and methods for fabricating such structures.

Resistive random access memory (ReRAM) and magnetic random access memory (MRAM) provide embedded non-volatile memory technologies that contrast with other types of volatile memory technologies, such as static random access memory (SRAM) and dynamic random access memory (DRAM). Because ReRAM and MRAM memory elements are non-volatile, the stored content is retained when the memory elements are not powered, which contrasts with SRAM memory elements in which the stored content is eventually lost when unpowered and DRAM memory elements in which the stored content is lost if not periodically refreshed.

A non-volatile memory includes multiple active bitcells that are arranged in an array of rows and columns. Each active bitcell in the array includes a field-effect transistor that controls access to the non-volatile memory element for reading and writing binary data. A wordline is connected to the gates of the transistors in each row of the array. The wordline may be used to select the field-effect transistors in a particular row of active bitcells for data read and write operations to the related memory elements. Metal contacts may be used to contact each individual gate of the field-effect transistors in the given row of the array with their wordline. However, this inefficient connection scheme leads to overly-large active bitcell areas.

Improved structures for a non-volatile memory and methods for fabricating such structures are needed.

SUMMARY

According to an embodiment of the invention, a memory structure includes an active array region having a plurality of active bitcells and a wordline, a plurality of dummy bitcells arranged in a column within the active array region, and an interconnect structure. The interconnect structure includes a metallization level having a wordline strap that extends across the active array region and that is arranged over the active array region.

According to another embodiment of the invention, a method is provided for forming a memory structure. The method includes forming an active array region including a wordline, and forming a plurality of dummy bitcells arranged in a column within the active array region. The method further includes forming an interconnect structure with a metallization level having a wordline strap that extends across the active array region and that is arranged over the active array region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
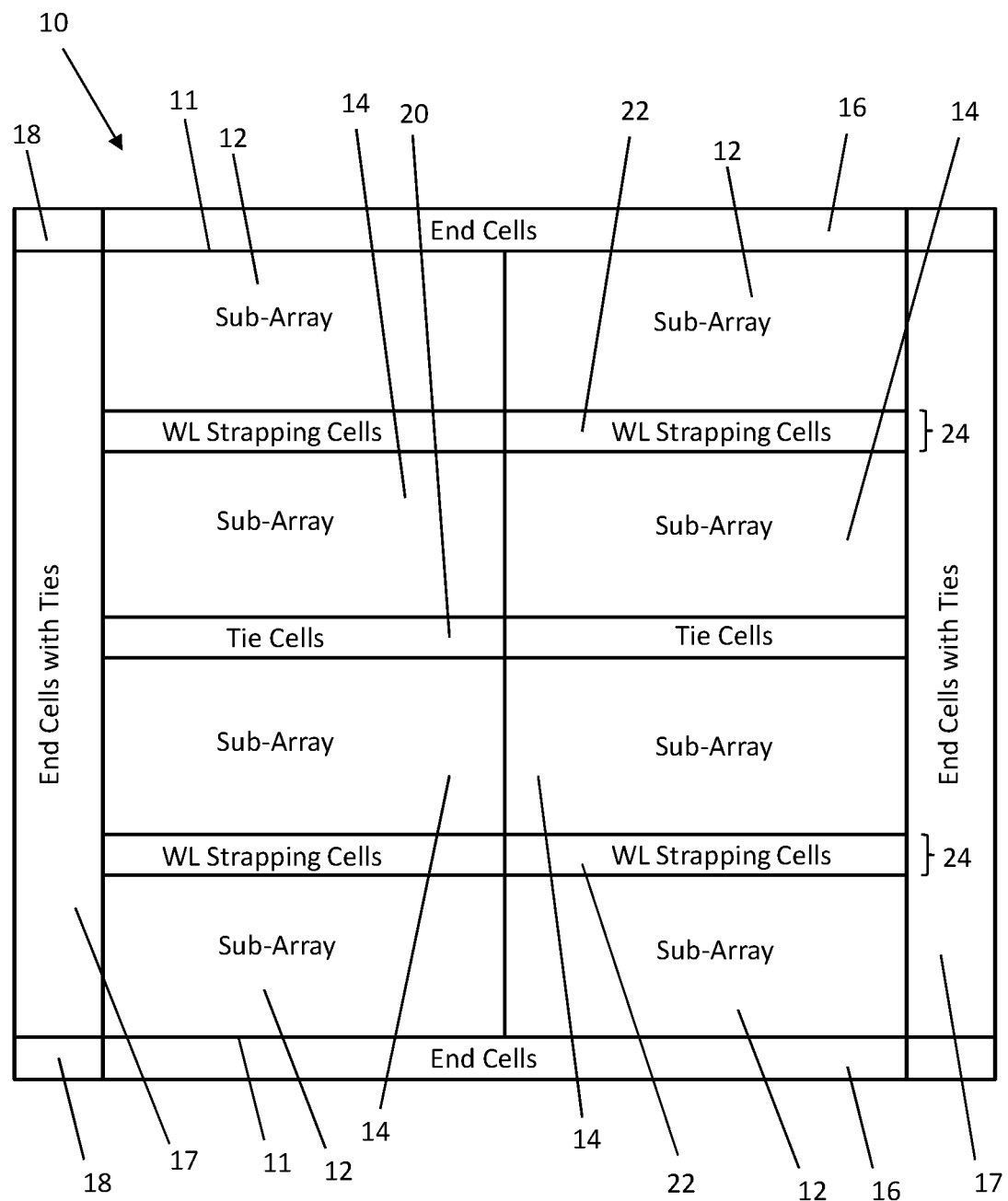
FIG. 1 is a top view of a memory array structure in accordance with embodiments of the invention.

With reference to FIG. 1 and in accordance with embodiments of the invention, an array structure 10 for a non-volatile memory includes multiple sub-arrays 12, 14 of active bitcells (FIG. 4) that are arranged in rows and columns within active array regions 11. The array structure 10 further includes end cells 16 and end cells 17 that are peripherally arranged adjacent to the side edges of the sub-arrays 12, 14 and that intersect at corners 18. The array structure 10 further includes tie cells 20 that extend across the array structure 10 in a space between the active array regions 11 and that intersect with the end cells 16. The end cells 17 and tie cells 20 may be used to provide body contacts for the array structure 10. Each of the active bitcells in the sub-arrays 12, 14 may include a single field-effect transistor and a single memory element connect with the single field-effect transistor. Each of the sub-arrays 12, 14 in the array structure 10 may contain a row-column matrix of active bitcells, such as a matrix containing 64 active bitcells by 32 active bitcells.

The array structure 10 further includes a column 24 of wordline strapping cells 22 in which the wordline strapping cells 22 in the column 24 are arranged inside the interior of each of the active array regions 11. In an embodiment, all of the wordline strapping cells 22 in the column 24 are arranged inside the interior of each of the active array regions 11. The columns 24 of wordline strapping cells 22 may be used to strap the wordlines addressing the rows of active bitcells in the sub-arrays 12, 14 by establishing vertical interconnection between a wordline strap and each respective wordline. The wordline strapping cells 22 in each column 24 represent dummy bitcells that are non-functional, in comparison with the active bitcells of the sub-arrays 12, 14, due to the absence of an associated memory element and the absence of source regions and drain regions. Each of the columns 24 of wordline strapping cells 22 is arranged within the interior of one of the active array regions 11 between the sub-arrays 12 of active bitcells on one side and the sub-arrays 14 of active bitcells on the opposite side. The wordlines of the active bitcells in these adjacent sub-arrays 12, 14 are connected with an associated wordline strap via one of the columns 24 of wordline strapping cells 22.

Additional sets of sub-arrays 12, 14 and columns 24 of wordline strapping cells 22 may be added to the array structure 10 in order to expand its size. In particular, the wordline strapping cells 22 provide the ability to freely expand the array size due to being arranged over the active array regions 11 and extending across the active array regions 11.

Figure 2:
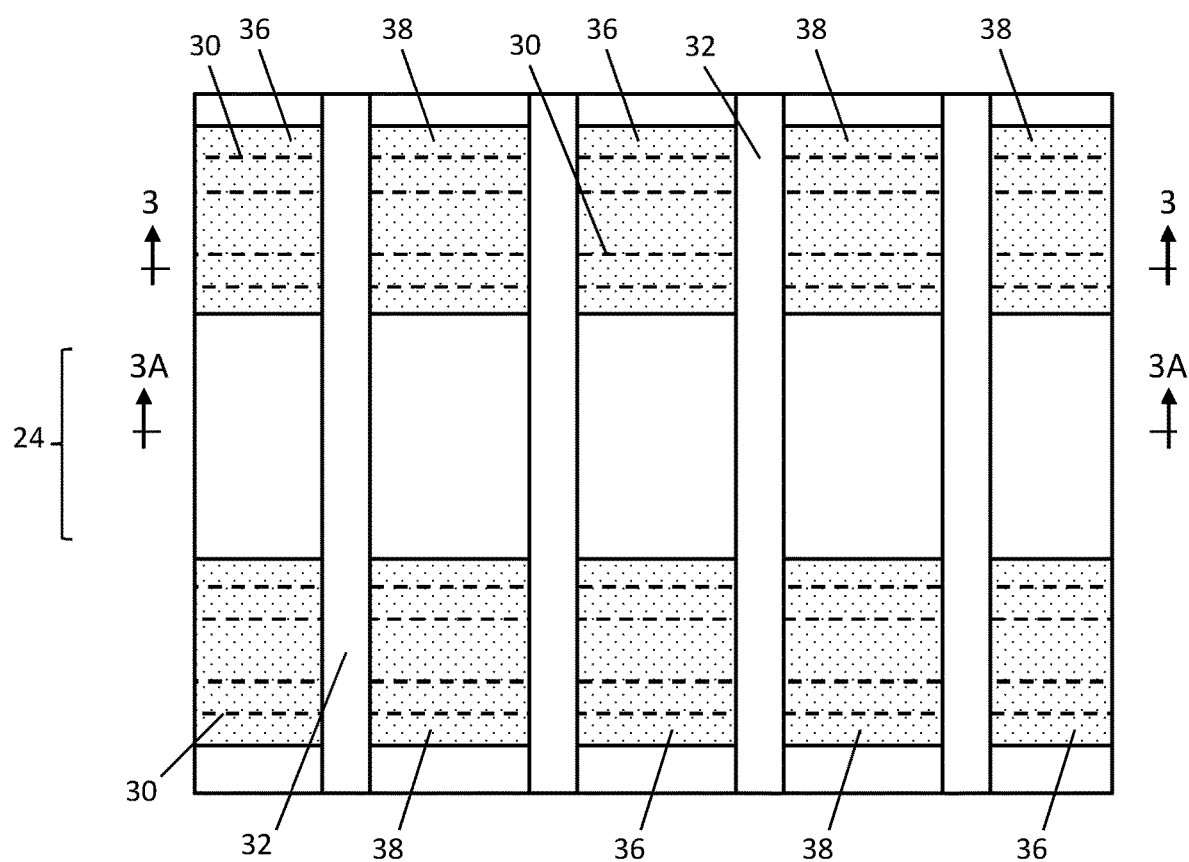
FIG. 2 is an enlarged top view of a portion of the memory array structure of FIG. 1 at an initial fabrication stage of a processing method.
Figure 3:
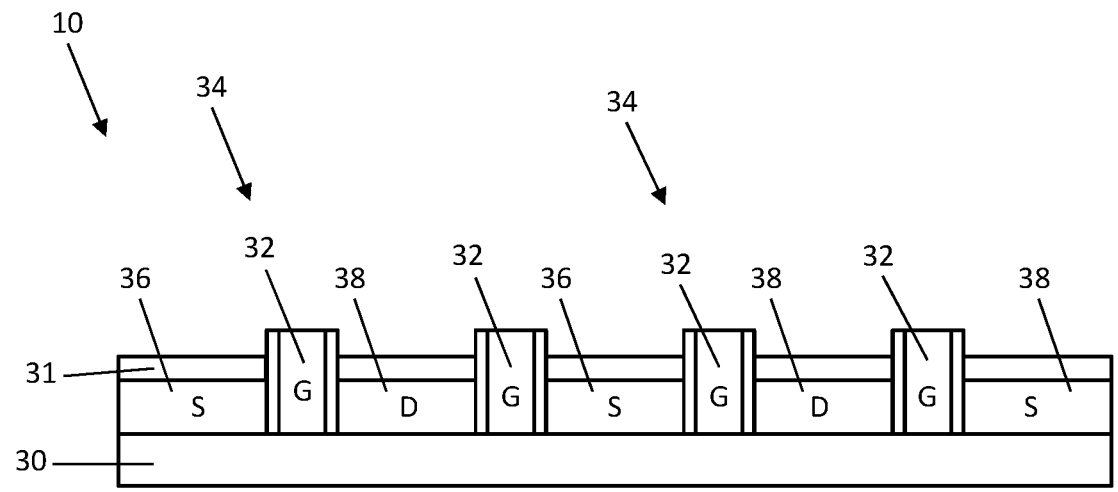
FIG. 3 is a cross-sectional view taken generally along line 3-3 in FIG. 2.
Figure 3A:
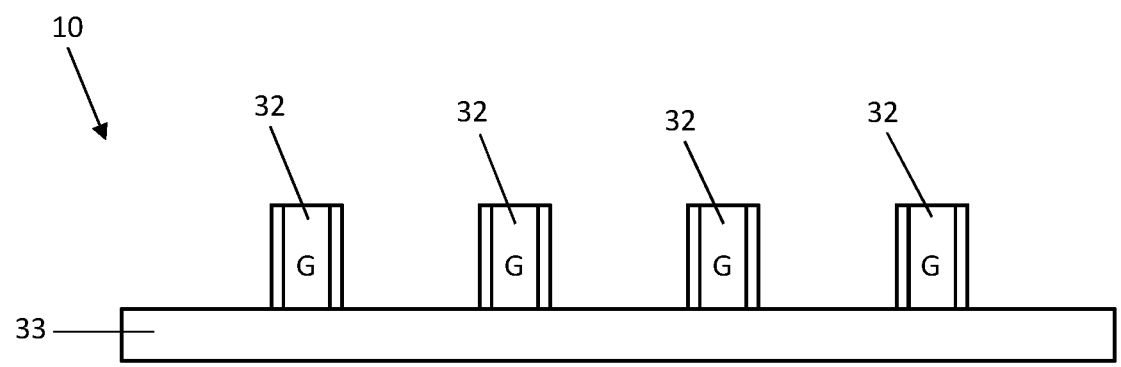
FIG. 3A is a cross-sectional view taken generally along line 3A-3A in FIG. 2.

With reference to FIGS. 2, 3, and 3A, the active bitcells in each of the sub-arrays 12, 14 include fins 30 and gate structures 32 that are arranged to overlap with the fins 30. The gate structures 32 function as wordlines for the active bitcells in each row of the sub-arrays 12, 14. The fins 30 and gate structures 32 are located on a substrate 33 that contains a semiconductor material, and the fins 30 may be surrounded by trench isolation regions 31. The fins 30 may be formed by patterning the substrate 33 or an epitaxial layer formed on the substrate 33 with lithography and etching processes. The fins 30 are cut and removed within the columns 24 of wordline strapping cells 22.

The gate structures 32 are aligned transverse to the fins 30 to provide an overlapping relationship on multiple sides of each fin 30. Each of the gate structures 32 includes a gate dielectric layer and a gate electrode that wraps about the sides of the overlapped fins 30 with the gate dielectric layer arranged between the gate electrode and the semiconductor material of the fins 30. The gate electrode may include one or more conformal barrier metal layers and/or work function metal layers, such as metal layers composed of titanium aluminum carbide and/or titanium nitride, and a metal gate fill layer composed of a conductor, such as tungsten. The gate dielectric layer may be composed of a high-k dielectric material, such as hafnium oxide.

As best shown in FIG. 3, the fins 30 and gate structures 32 within the sub-arrays 12, 14 are further processed to form field-effect transistors, generally indicated by reference numeral 34. Enlarged source regions 36 and enlarged drain regions 38 may be formed by epitaxial growth of semiconductor material from the fins 30. The semiconductor material of the source regions 36 and drain regions 38 may contain a dopant, such as an n-type dopant (e.g., phosphorus and/or arsenic) providing n-type electrical conductivity.

As best shown in FIG. 3A, the gate structures 32 within the column 24 of the wordline strapping cells 22 are not further processed to form field-effect transistors. The gate structure 32 associated with each row of active bitcells in the sub-arrays 12, 14 includes a section that extends across the wordline strapping cells 22 in each column 24. The columns 24 of wordline strapping cells 22 lack fins 30, which may be cut after fin formation. However, the wordline strapping cells 22 differ from the active bitcells in the sub-arrays 12, 14 in that fins 30 are cut and absent, and in that that the epitaxial semiconductor material of the source regions 36 and the drain regions 38 is absent in the absence of fins 30.

The fins 30 are formed with a uniform layout that extends across the active bitcells of the sub-arrays 12, 14 and that is taken into account within the columns 24 of wordline strapping cells 22 in which the fins 30 are removed after being formed as part of the uniform layout. The gate structures 32 are formed with a uniform layout that extends across the active bitcells of the sub-arrays 12, 14 and the columns 24 of wordline strapping cells 22. The continuity in the layout of the columns of active bitcells of the sub-arrays 12, 14 and the columns 24 of wordline strapping cells 22 provides uniformity in the dimensions of the active bitcells and non-active wordline strapping cells 22.

Figure 4:
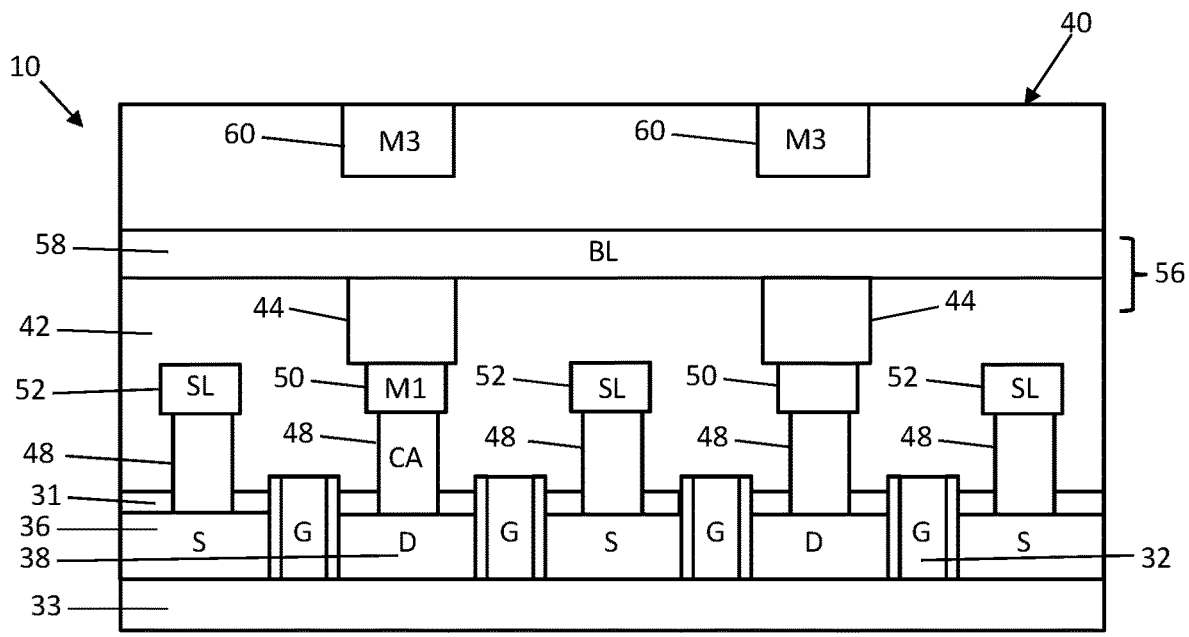
FIGS. 4 and 4A are cross-sectional views of the portion of the memory array structure at a fabrication stage of the processing method subsequent to FIGS. 3, 3A.
Figure 4A:
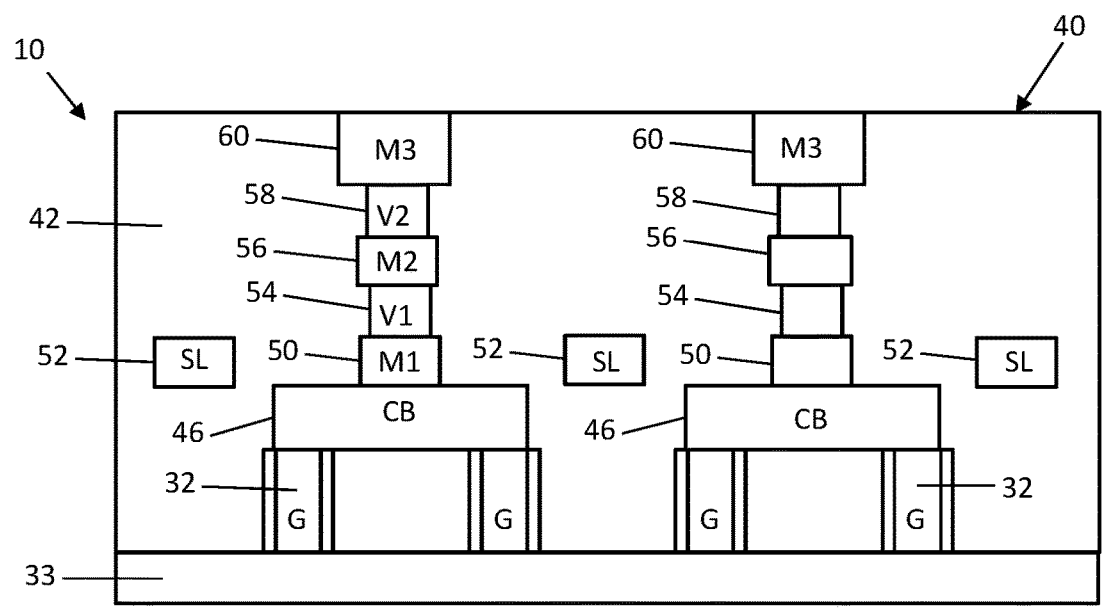

With reference to FIGS. 4, 4A in which like reference numerals refer to like features in FIGS. 3, 3A and at a subsequent fabrication stage, an interconnect structure, generally indicated by reference numeral 40, includes multiple metallization levels and via levels that may be formed in multiple dielectric layers 42 by middle-of-line (MOL) and back-end-of-line (BEOL) processes following the fabrication of the field-effect transistors 34 in the sub-arrays 12, 14. The metallization levels and via levels may be formed by damascene processes. Conductive features in the different metallization levels function to interconnect the field-effect transistors 34 with memory elements 44 in each row and column of active bitcells in one of the sub-arrays 12, 14 of the array structure 10 (FIG. 1) and to provide the connections needed to read and write data to the active bitcells. In an embodiment, the field-effect transistors 34 and the memory elements 44 may be characterized by a one-transistor/one-memory element arrangement.

The interconnect structure 40 includes gate (CB) contacts 46 that are physically and electrically connected with the gate electrodes of the gate structures 32. The CB contacts 46 are formed in contact openings defined by lithography and etching in one or more of the dielectric layers 42. The CB contacts 46 may contain a metal, such as tungsten, that is deposited by, for example, chemical vapor deposition and planarized by chemical-mechanical polishing. The interconnect structure 40 also includes source/drain (CA) contacts 48 that are physically and electrically connected with the source regions 36 and the drain regions 38. The CA contacts 48 may be formed in contact openings defined by lithography and etching in one or more of the dielectric layers 42. The CA contacts 48 may include a lower portion containing a metal silicide, such as tungsten silicide, titanium silicide, nickel silicide, or cobalt silicide, deposited by, for example, chemical vapor deposition, planarized by chemical-mechanical polishing, and recessed with a selective etching process, and an upper portion containing a metal, such as tungsten, formed in the contact openings by deposition and planarization.

A metallization (M1) level 50 of the interconnect structure 40 is formed over the field-effect transistors 34 and the contacts 46, 48. The M1 level 50 includes source lines (SL) 52 that are coupled by the CA contacts 48 with the source regions 36 of the field-effect transistors 34, as well as islands of metal connected by the CB contacts 46 with the gate electrodes of the gate structures 32 and islands of metal connected by the CA contacts 48 with the drain regions 38 of the field-effect transistors 34.

A via (V1) level 54 and a metallization (M2) level 56 of the interconnect structure 40 are formed over the metallization level 50. The M2 level 56 includes the memory elements 44 and a bit line (BL) 58 that is connected from above with the memory elements 44. As shown in FIG. 4, the memory elements 44 are connected with the islands of metal in the M1 level 50 that are arranged over the CA contacts 48. Additional bit lines are connected with other columns of memory elements 44 in the sub-arrays 12, 14.

A via (V2) level 58 and wordline straps 60 in a metallization (M3) level of the interconnect structure 40 are formed over the metallization level 56. As shown in FIG. 4A, each wordline strap 60 is connected to one of the wordlines (i.e., the gate electrode of one of the gate structures 32) associated with a particular row of the memory elements 44 in the sub-array 12 to permit the memory elements 44 in that row to be selected for data read and write operations. These connections are provided by vias in the V2 level 58 that are connected with islands of metal in the M2 level 56 and vias in the V1 level 54 that connect the islands of metal in the M2 level 56 with islands of metal in the M1 level 50, which are in turn connected with the CB contacts 46. The connections between the wordline straps 60 and the wordlines are established within the columns 24 of wordline strapping cells 22. As apparent, for example, in FIG. 4, the wordline straps 60 are not contacted with the wordlines over the sub-arrays 12, 14 of active bitcells that are adjacent to the columns 24 of wordline strapping cells 22.

Each wordline strap 60 and the associated gate structure 32 (i.e., wordline) are aligned parallel or substantially parallel with each other, and each wordline strap 60 may be arranged in the interconnect structure 40 directly over the wordline. The bit line 58 and the source lines 52 are used to read and write data values to the memory elements 44 in each column of the sub-arrays 12, 14. The wordline strapping cells 22 in each column 24 do not include the memory elements 44.

In an embodiment, the memory elements 44 may be resistive random access memory (ReRAM) elements that are non-volatile. Data is stored in each ReRAM element by changing the resistance across a layer containing a dielectric material to provide different states. The dielectric material, which is normally insulating, can be made to conduct through one or more filaments or conductive paths generated by applying a sufficiently high voltage. Each ReRAM element switches between the insulating and conducting phases by creating or destroying the filament(s) to respectively write either a "0" state or a "1" state.

In an embodiment, the memory elements 44 may be magnetoresistive random access memory (MRAM) elements that are non-volatile. Data is stored in each MRAM element through different states generated by a pinned magnetic layer and a free magnetic layer, each of which holds a magnetization. The magnetization of the pinned layer is fixed in its magnetic orientation, and the magnetization of the free layer can be changed by an external magnetic field generated by a programming current. In particular, the external magnetic field can cause the magnetic orientations of the magnetic layers to either be parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the MRAM memory element.

The array structure 10 relies on columns 24 each containing dummy bitcells (i.e., wordline strapping cells 22) to contact the wordlines of the active bitcells to wordline straps in an upper metallization level. This compact design may significantly improve the wordline resistance and, hence, the array access time with a minimal penalty on area. The array structure 10 also introduces a minimal disruption into the bitcell layout by not interrupting the pattern regularity. In that regard, the dummy bitcells constituting the wordline strapping cells 22 and the active bitcells of the sub-arrays 12, 14 have a uniform pattern.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory structure comprising:
   an active array region including a plurality of active bitcells and a wordline, the active bitcells arranged in a first plurality of sub-arrays and a second plurality of sub-arrays;
   a plurality of tie cells;
   a plurality of wordline strapping cells contained in a column, the column containing the wordline strapping cells located inside the active array region between the first plurality of sub-arrays and the second plurality of sub-arrays; and
   an interconnect structure including a first metallization level having a wordline strap, the wordline strap connected to the wordline within the column containing the wordline strapping cells,
   wherein the first plurality of sub-arrays are positioned in the active array region between the plurality of tie cells and the column containing the wordline strapping cells.

2. The memory structure of claim 1 wherein the wordline strap is aligned in the first metallization level of the interconnect structure substantially parallel to the wordline.

3. The memory structure of claim 1 wherein the wordline strap is arranged in the first metallization level of the interconnect structure directly over the wordline.

4. The memory structure of claim 3 wherein the wordline strap is aligned in the first metallization level of the interconnect structure substantially parallel to the wordline.

5. The memory structure of claim 1 wherein each active bitcell includes a memory element, and the dummy bitcells in the column are free of memory elements.

6. The memory structure of claim 5 wherein the memory element of each of the active bitcells is arranged in a second metallization level of the interconnect structure, and the wordline strap in the first metallization level is arranged over the second metallization level.

7. The memory structure of claim 5 wherein the memory element of each active bitcell is a magnetoresistive random access memory (MRAM) element.

8. The memory structure of claim 5 wherein the memory element of each active bitcell is a resistive random access memory (ReRAM) element.

9. The memory structure of claim 1 wherein each active bitcell includes a field-effect transistor having a source region and a drain region, the wordline provides a gate for the field-effect transistor of each active bitcell, and each wordline strapping cell in the column is free of source regions and drain regions.

10. The memory structure of claim 9 wherein the interconnect structure includes a plurality of contacts each connected with the drain of the field-effect transistor of one of the active bitcells, and the interconnect structure over the wordline strapping cells contained in the column is free of contacts.

11. The memory structure of claim 1 wherein each active bitcell has a first size, and each wordline strapping cell contained in the column has a second size that is equal to the first size.

12. The memory structure of claim 1 wherein the wordline strap is arranged in the first metallization level of the interconnect structure transverse to the column containing the wordline strapping cells.

13. The memory structure of claim 1 further comprising:
a plurality of end cells,
wherein the second plurality of sub-arrays are positioned between the column containing the wordline strapping cells and the plurality of end cells.

14. The memory structure of claim 1 wherein each of the first plurality of sub-arrays includes a first row-column matrix of the active bitcells, and each of the second plurality of sub-arrays includes a second row-column matrix of the active bitcells.

15. A method of forming a memory structure, the method comprising:
forming an active array region including a plurality of active bitcells and a wordline;
forming a plurality of wordline strapping cells contained in a column within the active array region;
forming a plurality of tie cells; and
forming an interconnect structure including a first metallization level having a wordline strap that is connected to the wordline within the column containing the wordline strapping cells,
wherein the active bitcells are arranged in a first plurality of sub-arrays and a second plurality of sub-arrays, the column containing the wordline strapping cells is located inside the active array region between the first plurality of sub-arrays and the second plurality of sub-arrays, and the first plurality of sub-arrays are positioned between the plurality of tie cells and the column containing the wordline strapping cells.

16. The method of claim 15 wherein the wordline strap is aligned in the first metallization level of the interconnect structure substantially parallel to the wordline.

17. The method of claim 15 wherein each active bitcell includes a non-volatile memory element, and the wordline strapping cells in the column are free of non-volatile memory elements.

18. The method of claim 17 wherein the non-volatile memory element of each active bitcell is arranged in a second metallization level of the interconnect structure, and the wordline in the first metallization level is arranged over the second metallization level.

\* \* \* \* \*